US012598695B2

(12) United States Patent
Saadat et al.

(10) Patent No.: US 12,598,695 B2
(45) Date of Patent: Apr. 7, 2026

(54) HALF-BRIDGE SWITCH ARRANGEMENT

(71) Applicant: SEG Automotive Germany GmbH, Stuttgart (DE)

(72) Inventors: Nima Saadat, Stuttgart (DE); Timm Lohmann, Stuttgart (DE); Murugaperumal Devaraja, Stuttgart (DE); Vivek Ratilal Tailor, Stuttgart (DE)

(73) Assignee: SEG Automotive Germany GmbH, Stuttgart (DE)

( * ) Notice: Subject to any disclaimer, the term of this patent is extended or adjusted under 35 U.S.C. 154(b) by 205 days.

(21) Appl. No.: 18/588,614

(22) Filed: Feb. 27, 2024

(65) Prior Publication Data

US 2024/0298402 A1 Sep. 5, 2024

(30) Foreign Application Priority Data

Mar. 3, 2023 (DE) .......................... 102023105345.0

(51) Int. Cl.
H05K 1/00 (2006.01)
H05K 1/02 (2006.01)
(52) U.S. Cl.
CPC ......... H05K 1/0256 (2013.01); H05K 1/0203 (2013.01); H05K 2201/10272 (2013.01)
(58) Field of Classification Search
CPC ............... H05K 1/0256; H05K 1/0203; H05K 2201/10272
See application file for complete search history.

(56) References Cited

U.S. PATENT DOCUMENTS

| | | | |
|---|---|---|---|
| 2006/0039127 A1* | 2/2006 | West ...................... | H05K 1/144 |
| | | | 257/691 |
| 2016/0242312 A1* | 8/2016 | Singh .................... | H01L 23/473 |
| 2022/0201862 A1* | 6/2022 | Hsu ...................... | H05K 7/2039 |

FOREIGN PATENT DOCUMENTS

DE 102013219833 A1 4/2015

* cited by examiner

*Primary Examiner* — Pete T Lee
(74) *Attorney, Agent, or Firm* — COZEN O'CONNOR

(57) ABSTRACT

A half-bridge switch arrangement includes a high-side switch having a plurality of parallel-connected first semiconductor switching elements, a low-side switch having a plurality of parallel-connected second semiconductor switching elements, a positive busbar to which a terminal of each of the first semiconductor switching elements of the high-side switch is electrically connected, a negative busbar to which a terminal of each of the second semiconductor switching elements of the low-side switch is electrically connected, and a heat sink, the heat sink having a first section and a second section disposed on the first section, the first semiconductor switching elements and the second semiconductor switching elements being disposed on the second section, wherein the positive busbar and the negative busbar are disposed one above the other on an upper surface of the first section.

16 Claims, 8 Drawing Sheets

HALF-BRIDGE SWITCH ARRANGEMENT

CROSS-REFERENCE TO RELATED APPLICATIONS

This application claims priority to German Patent Application No. 102023105345.0 filed Mar. 3, 2023, hereby incorporated in its entirety.

TECHNICAL FIELD

The present disclosure relates to a half-bridge switch arrangement.

BACKGROUND

Half-bridge switch arrangements can be used in power converters, for example, as inverters for alternating conversion between DC and AC voltages. For example, such half-bridge switch arrangements can be used in power modules in vehicles to convert a voltage between a DC on-board power supply and an electrical machine that can be operated with multi-phase AC voltage.

Such half-bridge switch arrangements usually have one half-bridge per phase with one high-side switch and one low-side switch. Individual, discrete semiconductor switching elements can be used as high-side or low-side switches, for example individual transistors such as FETs, MOSFETs, IGBTs, etc., or a parallel circuit consisting of a large number of such discrete semiconductor switching elements.

This type of parallel connection of discrete components as high-side switches or low-side switches enables high power scalability and high power or current levels to be achieved. However, this often results in a high DC link inductance and therefore a high total inductance of the commutation loop. It can also often prove difficult to cool such half-bridge switch arrangements sufficiently in order to keep temperatures at desired values at high currents and high switching frequencies.

SUMMARY

In an embodiment, a half-bridge switch arrangement has a high-side switch comprising a plurality of parallel-connected, discrete first semiconductor switching elements and a low-side switch comprising a plurality of parallel-connected, discrete second semiconductor switching elements. The individual semiconductor switching elements can each be designed, for example, as a transistor, e.g. as FETs, MOSFETs, IGBTs, etc.

Furthermore, the half-bridge switch arrangement has a positive busbar ("B+ busbar"), to which a first terminal of each of the first semiconductor switching elements of the high-side switch, in particular in each case a drain terminal, is electrically connected, and a negative busbar ("B− busbar"), to which a second terminal of each of the second semiconductor switching elements of the low-side switch, in particular in each case a source terminal, is electrically connected. For example, the positive and negative busbars can each be made of or comprise copper.

The half-bridge switch arrangement also has a heat sink, which is suitably provided and set up for cooling the busbars and the semiconductor switching elements. For example, the heat sink can be fluid-cooled and have an inlet and outlet for a corresponding cooling fluid. The cooling fluid can comprise oil, water, air, etc.

The heat sink has a first, lower section and a second, upper section arranged on this first section. In particular, a largest dimension, which can be referred to as the length, of the first section is greater than a largest dimension, which can be referred to as the length, of the second section. In particular, the heat sink is stepped or has a stepped profile in cross-section. The first section can, for example, represent a first, lower step and the second section a second, upper step. The first section and/or the second section can be cuboidal.

The first semiconductor switching elements and the second semiconductor switching elements are arranged on the second section, in particular on its upper side and/or on its side surfaces. Conveniently, the first semiconductor switching elements and the second semiconductor switching elements are in thermal contact with the second section. Heat generated by the semiconductor switching elements can be transferred directly to the heat sink and dissipated from it.

The positive busbar and the negative busbar are arranged one above the other on an upper side of the first section. The upper side of the first section is to be understood as the surface on which the second section is also arranged or from which it rises. In particular, the positive busbar and the negative busbar or their main extension planes are arranged parallel to each other and also, in particular, parallel to the upper side of the first section. Heat can therefore be transferred directly from the busbars to the heat sink and dissipated from it.

The disclosure provides a half-bridge switch arrangement with a low intermediate circuit inductance and a low thermal impedance, which can be cooled effectively.

By connecting discrete switching elements in parallel as high-side or low-side switches, a high scalability of the power can be achieved in particular. The number of semiconductor switching elements in the respective parallel circuit can be appropriately selected in order to achieve a desired power or a desired current. Furthermore, the overall costs for the circuit can be kept low by using discrete switching elements.

Conventionally, the use of parallel, discrete semiconductor switching elements can often lead to a high parasitic inductance, which can be critical at a high switching speed of WBG elements (wide-bandgap semiconductors, WBG), such as SiC or GaN. Such parasitic inductance can be minimized or at least reduced in the switch arrangement according to the disclosure.

The positive busbar and negative busbar are advantageously arranged close to each other, whereby inductive resistance can be reduced or kept low. In particular, a low DC link inductance and a low overall inductance of the commutation loop can be achieved. Due to the short distances between the lines or terminals of the switching elements and the busbars, the commutation loop can be improved. The busbars can, for example, be laminated busbars with very low inductance, which enable the half bridge to switch at very high speed.

By arranging the positive and negative busbars on the heat sink, the busbars can be cooled efficiently. In addition, by arranging the semiconductor switching elements on the heat sink, a low thermal impedance can be achieved and the heat released by the switching elements can be effectively dissipated to the heat sink. Although the positive and negative busbars are close to each other to influence the overall inductance of the commutation loop, busbars and switch elements can still be cooled effectively. In particular, the junction temperature of the switch elements can be kept at a desired value at high currents and high switching frequencies.

Instead of using PCB layers to produce the positive and negative busbars, copper plates can be used, for example, which are easy to bend and shape and are cheaper than thick copper conductor plates. Furthermore, the busbars can also be produced by welding onto a piece of metal such as copper, for example. The sizes and dimensions of the busbars can be chosen flexibly and freely and can be adapted to a given installation space, for example.

According to one embodiment, the positive busbar and the negative busbar are each plate-shaped or flat or rectilinear in cross-section and each have a recess through which the second section protrudes. The dimensions of the recess within the positive or negative busbar are in particular larger than the corresponding dimensions of the second section. In this way, it is expedient to achieve a large thermal contact surface between the arrangement of the positive and negative busbars and the first section of the heat sink, so that the busbars can be cooled effectively.

Alternatively, the positive busbar and the negative busbar can be formed as components of a common printed circuit board, which has a recess through which the second section protrudes. For example, the positive and negative busbars can each be formed as layers of the common circuit board, e.g. a thick copper circuit board.

According to one embodiment, the half-bridge switch arrangement also has an output-phase busbar, to which a second terminal of each of the first semiconductor switching elements, in particular a source terminal, and a first terminal of the second semiconductor switching elements, in particular a drain terminal, are electrically connected. The positive busbar, the negative busbar and the output-phase busbar are arranged one above the other on the upper side of the first section. Conveniently, the positive busbar, the negative busbar and the output-phase busbar (i.e. their main extension planes) are each arranged parallel to each other and parallel to the upper surface of the first section. In particular, the output-phase busbar is arranged on the arrangement of the positive busbar and the negative busbar, i.e. the output-phase busbar is arranged further away from the top of the first section than the positive and negative busbars. Conveniently, heat can be dissipated from the output-phase busbar to the heat sink via the positive and negative busbars. Alternatively, the positive busbar, the negative busbar and the output-phase busbar can be formed as components, e.g. as layers, of a common printed circuit board, which is arranged on the upper side of the first section.

According to one embodiment, the output-phase busbar is plate-shaped and has a recess through which the second section protrudes. The shape of the output-phase busbar is thus conveniently similar to the shape of the positive and negative busbar. In particular, a part of the arrangement of the positive and negative busbar is covered by the output-phase busbar and another part of the arrangement of the positive and negative busbar is expediently not covered by the output-phase busbar. Further elements which are electrically connected to the positive and negative busbar, e.g. a capacitor unit, can usefully be arranged on this uncovered part.

According to one embodiment, the half-bridge switch arrangement also has at least one electrical output-phase insulating layer, the output-phase busbar being electrically insulated from the positive busbar and/or from the negative busbar and/or from the heat sink by the at least one electrical output-phase insulating layer. These one or more output-phase insulating layers can also each be suitably plate-shaped and arranged with their main extension planes parallel to the main extension plane of the output-phase busbar.

For example, a first output-phase insulating layer can be arranged on a lower side of the output-phase busbar and a second output-phase insulating layer can be arranged on an upper side of the output-phase busbar. Conveniently, the output-phase busbar can be electrically insulated from the arrangement of the positive and negative busbar by this first output-phase insulating layer arranged on the underside. For example, further elements can be arranged on the second output-phase insulating layer, whereby the output-phase busbar is electrically insulated from these further elements by this second insulating layer. The output-phase insulating layers can each be designed as a heat conducting pad, for example.

According to one embodiment, the first semiconductor switching elements and the second semiconductor switching elements are each arranged on an upper side of the second section. In particular, the upper side of the second section is parallel to the upper side of the first section. In particular, the respective main extension plane of the individual semiconductor switching elements is oriented parallel or at least substantially parallel to the upper side of the second section, the main extension plane of the positive busbar, the main extension plane of the negative busbar and the upper side of the second section.

According to one embodiment, the respective terminals of the first semiconductor switching elements and the second semiconductor switching elements for connection to the positive busbar and the negative busbar, in particular the respective drain and source terminals, are each bent or kinked in the direction of the first section. For example, the terminals can each be designed as pins or wires, which are led out of the respective semiconductor switching element, in particular parallel to its main extension plane, and are then bent or kinked accordingly. In particular, the terminals can be bent or kinked downwards by 90° or at least essentially by 90° starting from the main plane of extension of the respective switching element. A switching element connection channel can be provided, in particular in the arrangement of the positive busbar and the negative busbar and also the output-phase busbar, in order to guide or pass the respective terminals of the semiconductor switching elements to the respective busbar for electrical connection, in particular without contacting the other busbars.

According to one embodiment, the half-bridge switch arrangement further comprises a printed circuit board or control board, wherein the printed circuit board is arranged above the first semiconductor switching elements and second semiconductor switching elements which are in turn arranged on the upper side of the second section. In particular, the printed circuit board is arranged at a predetermined distance above the upper side of the second section. In particular, the printed circuit board is plate-shaped and is arranged with its main extension plane parallel to the main extension plane of the positive busbar and the negative busbar and also to the upper sides of the first and second sections. The positive busbar and the negative busbar are conveniently electrically connected to the printed circuit board. In each case, at least one third terminal of the first semiconductor switching elements and of the second semiconductor switching elements is bent or kinked in the direction of the printed circuit board for connection to the printed circuit board. In particular, each semiconductor switching element can have a gate terminal and a Kelvin terminal (also referred to as a Kelvin source terminal or auxiliary source terminal) as the at least one third terminal. Such a Kelvin source terminal can decouple the path of a load current from the path of a control current, which can lead to improved switching properties. These third terminals are also designed in particular as pins or wires, which are led out of the respective semiconductor switching element, in particular parallel to its main extension plane, and are then bent or kinked accordingly. Conveniently, these terminals are each bent or kinked upwards by 90° or at least substantially by 90° starting from the main extension plane of the respective switching element.

According to one embodiment, the first semiconductor switching elements and the second semiconductor switching elements are each arranged on a side surface of the second section. In particular, these side surfaces of the second section are oriented perpendicular to its upper side and perpendicular to the upper side of the first section. For example, the first semiconductor switching elements can be arranged on a first side surface of the second section and the second semiconductor switching elements can be arranged on a second side surface opposite the first side surface. In particular, the respective main extension plane of the individual semiconductor switching elements according to this embodiment is oriented perpendicularly or at least substantially perpendicularly to the upper side of the second section, the main extension plane of the positive busbar, the main extension plane of the negative busbar and the upper side of the second section. The individual terminals, in particular in the form of pins or wires, are conveniently led out of the respective semiconductor switching element parallel to its main extension plane in the direction of the busbars for connection to these. For example, a switching element connection channel is provided, in particular in the arrangement of the positive busbar, the negative busbar and the output-phase busbar, in order to guide or pass the respective terminals of the switching elements for electrical connection to the respective busbar, in particular without contacting the other busbars.

According to one embodiment, the half-bridge switch arrangement has a printed circuit board, with at least one third terminal of each of the first semiconductor switching elements and second semiconductor switching elements arranged on the side surfaces of the second section being connected to the printed circuit board. In particular, each semiconductor switching element can have a gate terminal and a Kelvin terminal as the at least one third terminal. This printed circuit board is arranged on the arrangement comprising the positive busbar, the negative busbar and the output-phase busbar. The positive busbar, the negative busbar, the output-phase busbar and the printed circuit board (i.e. their main extension planes) are thus oriented in particular parallel to each other and parallel to the upper side of the first and second sections. In particular, the printed circuit board is arranged further away from the top of the first section than the positive busbar, negative busbar and output-phase busbar.

According to one embodiment, the printed circuit board arranged on the positive busbar, the negative busbar and the output-phase busbar is plate-shaped and has a recess through which the second section of the heat sink protrudes. The shape of the printed circuit board is particularly similar to the shape of the positive and negative busbar and the output-phase busbar. In particular, a part of the arrangement of the positive and negative busbar is covered by the output-phase busbar and the printed circuit board, whereas another part is not covered by the output-phase busbar and the printed circuit board, wherein further elements can be arranged on this uncovered part and electrically connected to the positive and negative busbar. In particular, it is also conceivable that the positive busbar, the negative busbar and the output-phase busbar are formed as components, e.g. layers, of a common printed circuit board, this common printed circuit board conveniently having a recess through which the second section of the heat sink protrudes. Further logic elements can also be provided, e.g. additional printed circuit boards or control boards.

According to one embodiment, the half-bridge switch arrangement also has a capacitor unit or capacitor bank, which in turn has at least one discrete capacitor element, in particular a plurality of discrete capacitor elements connected in parallel. The capacitor unit is arranged on the arrangement comprising the positive busbar and the negative busbar. As explained above, the dimensions of the output-phase busbar and possibly the printed circuit board can each be smaller than the dimensions of the positive busbar and the negative busbar, so that an uncovered part of the arrangement comprising the positive and negative busbars is not covered by the output-phase busbar and the printed circuit board. The capacitor unit can be conveniently arranged on this uncovered part.

The capacitor unit or its capacitor elements are DC link capacitors in particular. The design and shape of the busbars can be used to provide sufficient space for these DC link capacitors, which can reduce the inductance of the commutation loop. By placing the DC link capacitors as close as possible to the switching elements, inductance in particular can be reduced. Due to the short distances between the lines of the switching elements, the busbars and the capacitor unit, the commutation loop can be improved. The positioning of the capacitor unit and its connection to the busbars is easy to implement during the manufacturing process. In particular, the distance between the DC link capacitors and the switching elements can be as symmetrical as possible. For example, the capacitor unit can be cuboid in shape and have a special cuboid capacitor element or a large number of discrete capacitor elements arranged in a cuboid housing.

According to one embodiment, a first terminal of the capacitor unit is electrically connected to the positive busbar and a second terminal of the capacitor unit is electrically connected to the negative busbar. In a first busbar selected from the positive busbar and negative busbar, which is arranged further away from the first section, a capacitor connection channel is provided, e.g. in the form of a bore or a hole, through which the terminal of the capacitor unit is guided or passed, which is electrically connected to a second busbar or to the other busbar selected from the positive busbar and negative busbar. The capacitor unit is therefore directly connected to the first busbar, which is located further away. Since the capacitor unit cannot easily be connected directly to the lower busbar due to the parallel arrangement of the positive and negative busbars, the capacitor connection channel is provided in the upper busbar, through which the corresponding terminal of the capacitor unit can nevertheless be contacted with the lower busbar in a structurally simple manner.

According to one embodiment, the half-bridge switch arrangement has an electrical busbar insulating layer, whereby the positive busbar and the negative busbar are electrically insulated from each other by the busbar insulating layer. In particular, the electrical busbar insulating layer corresponding to the positive and negative busbars is plate-shaped with a recess for the second section and is arranged between these busbars.

According to one embodiment, the half-bridge switch arrangement has an electrical heat sink insulating layer, wherein the arrangement comprising the positive busbar and the negative busbar is electrically insulated from the heat sink by the heat sink insulating layer. In particular, the electrical heat sink insulating layer is also plate-shaped with a recess for the second section and is conveniently arranged directly on the upper side of the first section of the heat sink or between the upper side of the first section and the arrangement of the positive busbar and the negative busbar.

According to one embodiment, the half-bridge switch arrangement has at least one first electrical switching element insulating layer and at least one second electrical switching element insulating layer, wherein the first semiconductor switching elements are electrically insulated from the heat sink, in particular from the second section of the heat sink, by the at least one first electrical switching element insulating layer, and wherein the second semiconductor switching elements are electrically insulated from the heat sink, in particular from its second section, by the at least one second electrical switching element insulating layer. For example, a separate insulating layer can be provided for each switching element or a common insulating layer can also be provided for several switching elements. In particular, the switching element insulating layers represent a thermal interface material (TIM) between the switching elements and the heat sink and can usefully each have a low thermal resistance or a high thermal conductivity. For example, the switching element insulating layers can each be designed as a ceramic layer with very low thermal resistance. These switching element insulating layers allow heat to be effectively transferred from the semiconductor switching elements to the heat sink and dissipated from it. When switching elements are arranged directly on a printed circuit board in the conventional manner, the thermal resistance of the printed circuit board and the thermal interface material is often not particularly low, so that the switching elements often cannot easily be kept below a desired temperature. In contrast, in the present switch arrangement, the junction temperature of the switching elements can be kept at a desired value even at high current and high switching frequencies.

The half-bridge switch arrangement or half-bridge power stage can be used in particular in a power converter or power converter circuit, for example in an inverter or inverter for alternating conversion between direct and alternating voltages. The half-bridge switch arrangement is particularly suitable for use in a vehicle, for example to convert a voltage between a DC on-board power supply and an electrical machine that can be operated with a multi-phase AC voltage. By connecting the semiconductor switching elements in parallel as high-side or low-side switches, the desired power or current levels can be achieved, particularly in high-power converters in the vehicle sector.

Further advantages and embodiments of the disclosure are shown in the description and the accompanying drawing.

The disclosure is illustrated schematically in the drawing by means of embodiment examples and is described below with reference to the drawing.

BRIEF DESCRIPTION OF THE DRAWINGS

FIGS. 2a-2d schematically show perspective views of a half-bridge switch arrangement, in embodiments.

DETAILED DESCRIPTION

Figure 1:
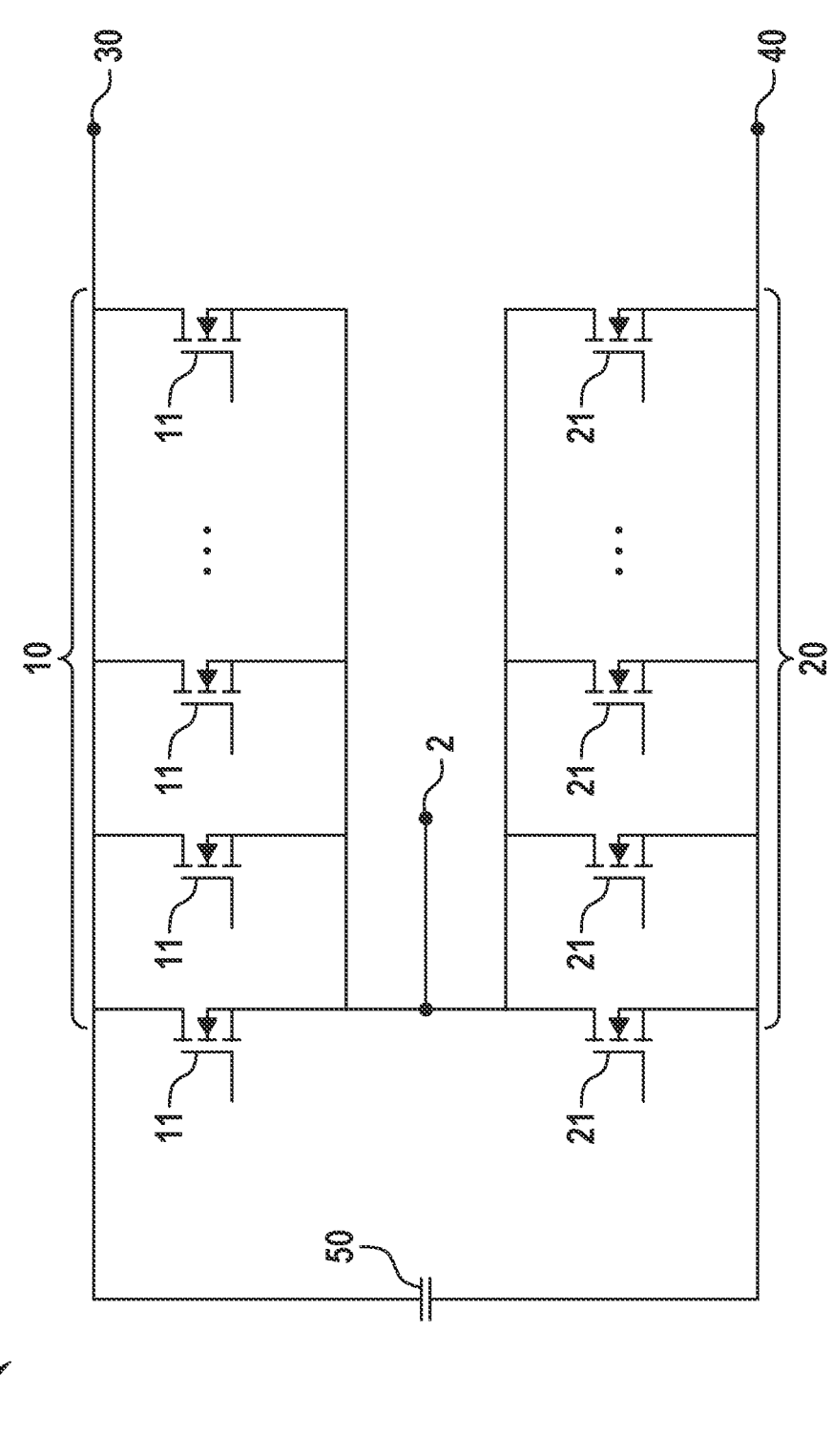
FIG. 1 schematically shows an embodiment of a half-bridge switch arrangement according to the disclosure as an electrical circuit diagram.

FIG. 1 schematically illustrates one embodiment of a half-bridge switch arrangement according to the disclosure as an electrical circuit diagram that is labeled 1.

The half-bridge switch arrangement 1 is provided for rectifying or alternating current between DC voltage terminals 30, 40 and an AC voltage terminal 2 and has a high-side switch 10 and a low-side switch 20. The high-side switch 10 has a plurality of discrete first semiconductor switching elements 11 connected in parallel, e.g. each in the form of a metal-oxide-semiconductor field-effect transistor (MOSFET) or an insulated-gate bipolar transistor (IGBT). Accordingly, the low-side switch 20 also has a plurality of parallel-connected, discrete second semiconductor switching elements 21, each of which can be designed, for example, as a MOSFET or IGBT. The number of semiconductor switching elements 11 or 21 can be selected in each case in order to achieve a desired power or a desired current.

The first semiconductor switching elements 11 of the high-side switch 10 are electrically connected to a positive busbar at their drain terminal (first terminal) and the second semiconductor switching elements 21 of the low-side switch 20 are electrically connected to a negative busbar at their source terminal (second terminal). Furthermore, an intermediate circuit capacitor 50 is provided, which is electrically connected to the positive busbar and to the negative busbar.

For example, the arrangement 1 can be used in a vehicle, wherein the DC voltage connections 30, 40 can be connected, for example, to a DC on-board power supply and wherein a phase of an electrical machine can be connected to the AC voltage connection 2, for example.

The electrical machine can be a multi-phase machine, e.g. with typically three or more phases. In particular, a half-bridge with high-side and low-side switches is provided for each of the phases, as shown in FIG. 1. Furthermore, in particular a control unit for controlling the individual switching elements 11, 21 can be provided, wherein the control unit can control the gate terminals of the switching elements 11, 21 in such a way that a direct or alternating current flows.

Figure 2A:
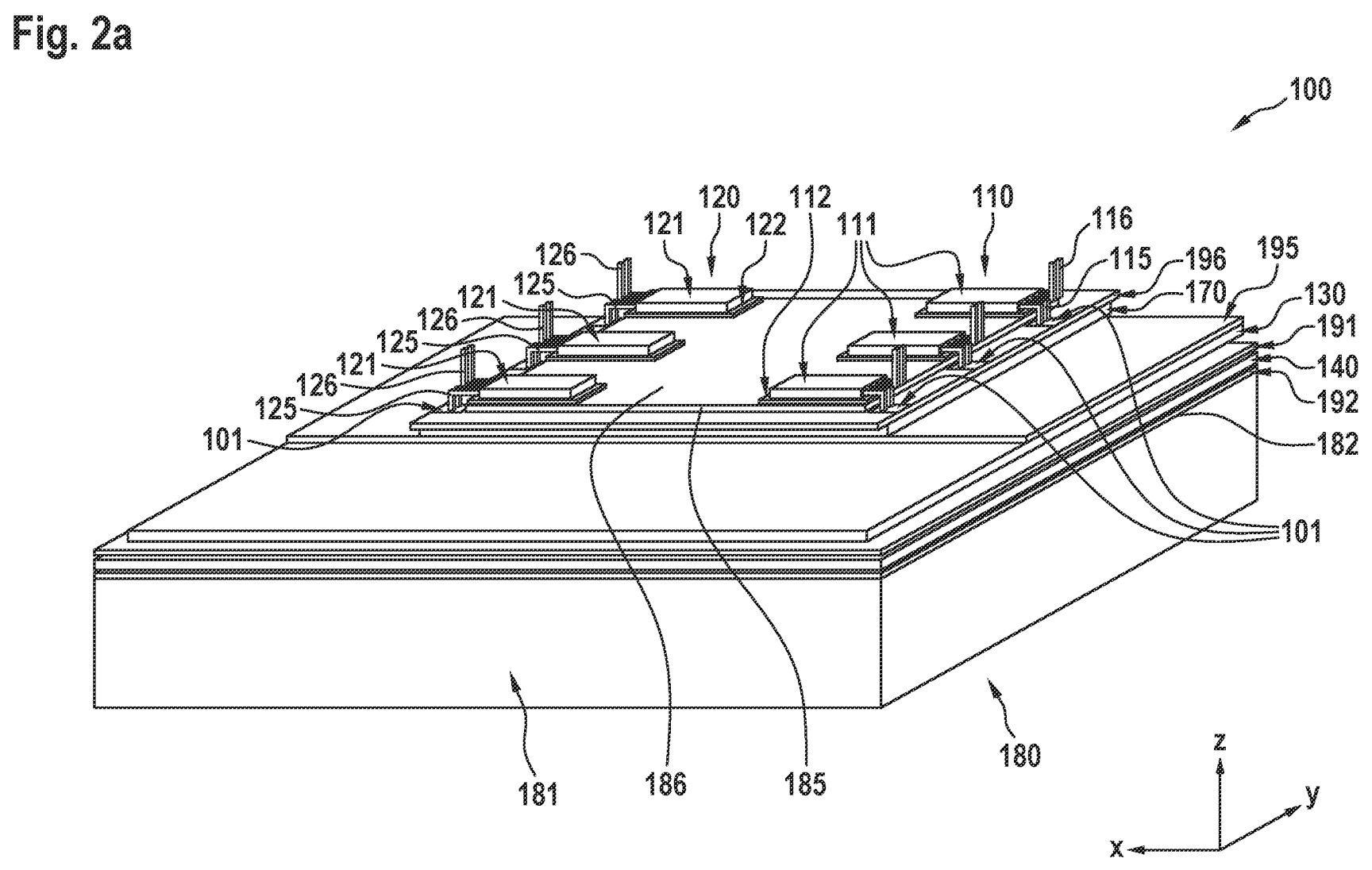

FIG. 2a shows a schematic perspective view of one embodiment of a half-bridge switch arrangement according to the disclosure that is labeled 100.

In accordance with the electrical circuit diagram shown in FIG. 1, the half-bridge switch arrangement 100 has a high-side switch 110 and a low-side switch 120, wherein the high-side switch 110 has a plurality of parallel-connected, discrete first semiconductor switching elements 111, and wherein the low-side switch 120 has a plurality of parallel-connected, discrete second semiconductor switching elements 121. The semiconductor switching elements 111 and 121 are each designed, for example, as a MOSFET or IGBT. In FIG. 2a, three first or second semiconductor switching elements 111 or 121 are provided as examples, but the number of semiconductor switching elements can also be larger or smaller, in particular depending on the desired power or desired current that is to flow through the semiconductor switching elements in total.

A positive busbar 130 is provided, to which the drain terminals (first terminal) of the first semiconductor switching elements 111 of the high-side switch 110 are electrically connected. A negative busbar 140 is provided, to which the source terminals (second terminal) of the second semiconductor switching elements 121 of the low-side switch 120 are electrically connected.

A heat sink 180 is provided to cool the busbars 130, 140 and the semiconductor switching elements 111, 121. The heat sink 180 can be fluid-cooled and have fluid connections for a cooling fluid. The fluid can be, for example, oil, cooling water, but also cooling air, i.e. air can also flow through it, for example.

The heat sink 180 is step-shaped and has a first, lower section 181 on which a second, upper section 185 is arranged. The sections 181 and 185 are cuboid in shape, each having a length, width and height. As can be seen in particular from FIG. 2d, the length of the first cuboidal section 181 viewed in the x-direction is greater than the length in the x-direction of the second cuboidal section 185. The width in the y-direction of the first cuboidal section 181 is also greater than the width of the second cuboidal section 185. Furthermore, the height in the z-direction of the first cuboidal section 181 is also greater than the height of the second cuboidal section 185.

The first and second semiconductor switching elements 111, 121 are arranged at the second cuboid section 185 of the heat sink 180 so that an outer surface of the semiconductor switching elements 111, 121 is in thermal contact with this second cuboid section 185.

Figure 2B:
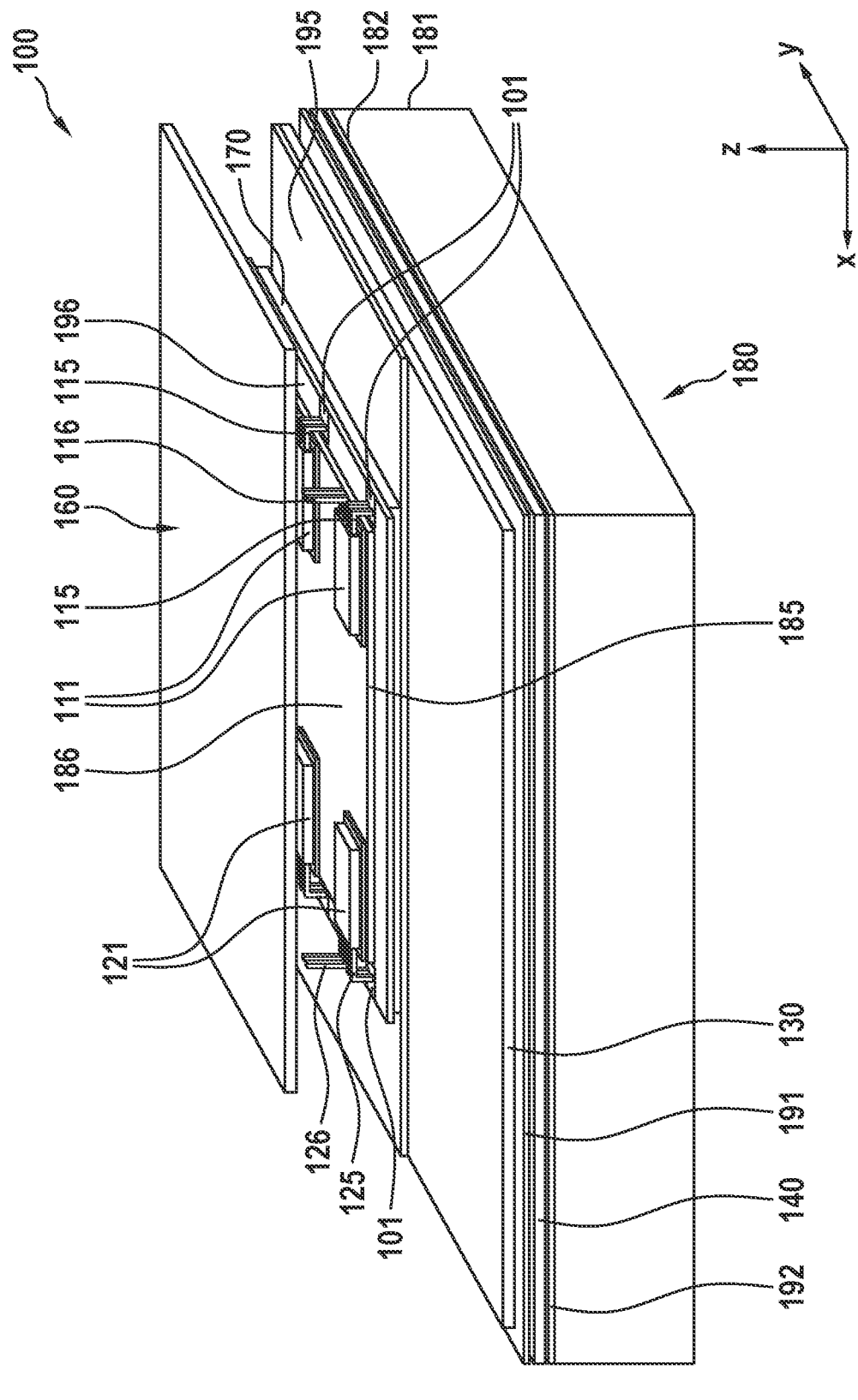
Figure 2C:
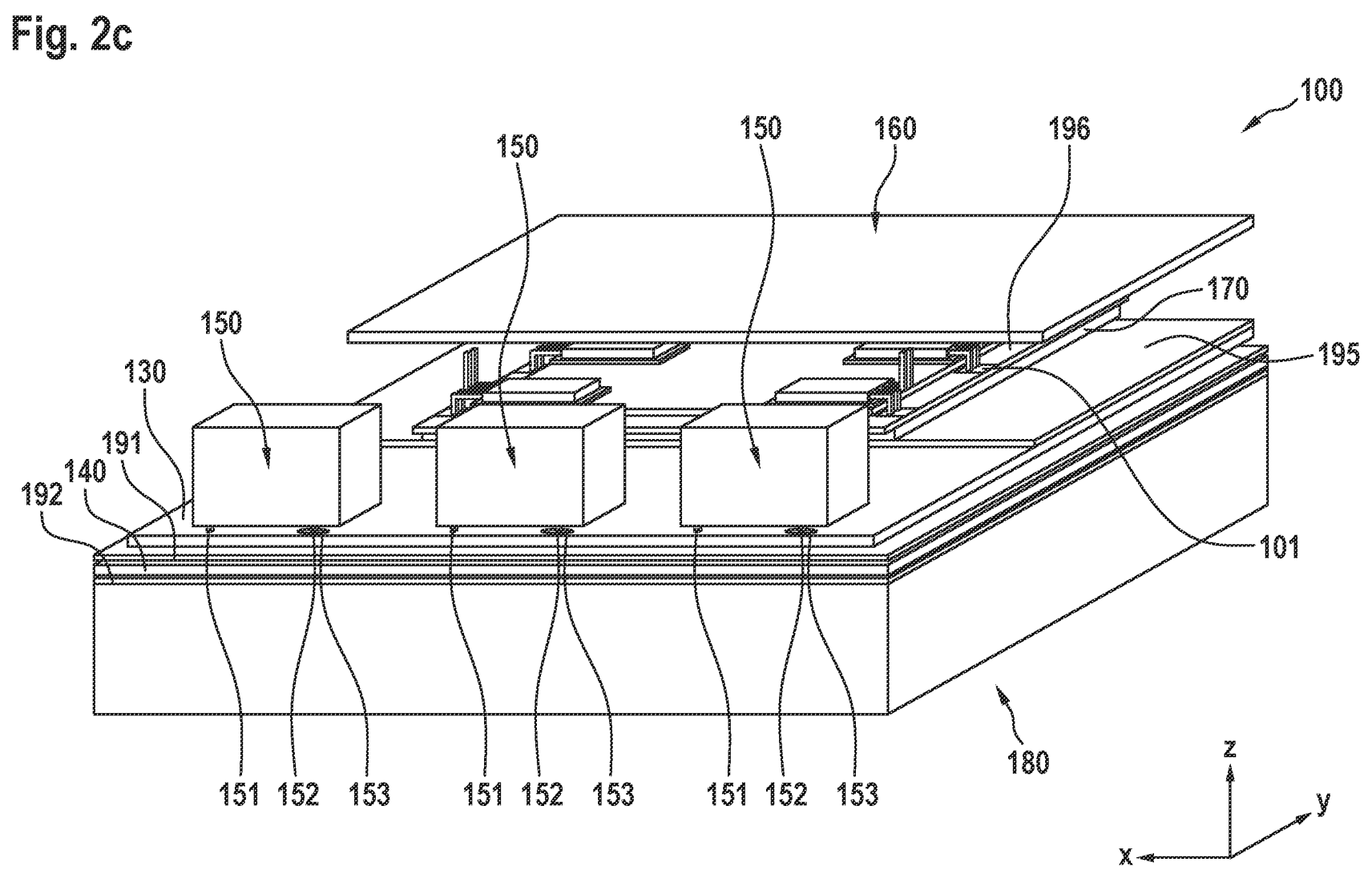

According to the embodiment shown in FIGS. 2a to 2c, the semiconductor switching elements 111, 121 are each arranged on an upper side 186 of the second cuboid section 185. As shown in FIG. 2a, the first semiconductor switching elements 111 can be arranged, for example, adjacent to a first side edge of the upper side 186 of the second cuboid section 185 and the second semiconductor switching elements 121 adjacent to a second side edge opposite the first side edge.

At least one first electrical switching element insulating layer 112 is provided, by means of which the first semiconductor switching elements 111 are electrically insulated from the second cuboid section 185 of the heat sink 180. Correspondingly, at least one second electrical switching element insulating layer 122 is provided, by which the second semiconductor switching elements 121 are electrically insulated from the second cuboid section 185 of the heat sink 180. As shown in FIG. 2a, a separate electrical insulating layer 112 or 122 may be provided for each switching element 111 or 121.

On an upper surface 182 of the first cuboid section 181, the positive busbar 130 and the negative busbar 140 are arranged one above the other. The positive and negative busbars 130, 140 are electrically insulated from each other by an electrical busbar insulating layer 191, which is arranged between the two busbars 130, 140. Further, the positive and negative busbars 130, 140 are electrically insulated from the heat sink 180 by an electrical heat sink insulating layer 192, which is disposed between the upper surface 182 of the first cuboid section 181 and the negative busbar 140.

Furthermore, an output-phase busbar 170 is arranged on the arrangement comprising the positive busbar 130 and the negative busbar 140. A first electrical output-phase insulating layer 195 is provided below the output-phase busbar 170 (or between the output-phase busbar 170 and the positive busbar 130 in this case), and a second electrical output-phase insulating layer 196 is provided above the output-phase busbar 170 in order to electrically insulate the output-phase busbar 170.

The positive busbar 130, the negative busbar 140 and the output-phase busbar 170 as well as the busbar insulating layer 191, the heat sink insulating layer 192 and the first and second output-phase insulating layers 195, 196 are each plate-shaped with a recess through which the second cuboid section 185 of the heat sink 180 protrudes.

Individual, some or all of the busbar insulating layer 191, the heat sink insulating layer 192, the output-phase insulating layers 195, 196 and the switching element insulating layers 112, 122 may each have a low thermal resistance or a high thermal conductivity. For example, the thermal conductivity of the insulating layers can each be more than 1, 10 or 100 W/(m·K). In this way, waste heat from the individual semiconductor switching elements 111, 121 and the busbars 130, 140 or 170 can be effectively transferred to the heat sink 180 and dissipated from it.

First and second terminals 115 of the first semiconductor switching elements 111 and first and second terminals 125 of the second semiconductor switching elements 121, in particular the drain and source terminals of these switching elements 111, 121, are each bent or kinked in the direction of the first cuboid section 181 for connection to the positive busbar 130, the negative busbar 140 or the output-phase busbar 170. These individual terminals 115, 125 are each formed, for example, as pins or wires which are led out of the respective semiconductor switching element parallel to its main extension plane (in the figure the xy plane) in the x-direction and are then bent or kinked downwards by at least substantially 90° in the z-direction.

In the arrangement comprising the positive busbar 130, the negative busbar 140 and the output-phase busbar 170 as well as the busbar insulating layer 191, the heat sink insulating layer 192 and the first and second output-phase insulating layers 195, 196, switching element connection channels 101 are provided, through which the respective terminals 115, 125 of the semiconductor switching elements 111, 121 are guided or passed for electrical connection to the respective busbar without contacting the other busbars.

In each case at least one third terminal 116 of the first semiconductor switching elements 111 and in each case at least one third terminal 126 of the second semiconductor switching elements 121 is bent or kinked upwards in the opposite direction to the first and second terminals 115 and 125, respectively, for connection to a printed circuit board. For example, each of the first and second semiconductor switching elements 111, 121 may have a gate terminal and a Kelvin source terminal as third terminals 116, 126, respectively. These third terminals 116, 126 are also each formed as pins or wires, which are led out of the respective semiconductor switching element 111, 121 parallel to the main extension plane and are then bent or kinked upwards by at least substantially 90°.

FIG. 2b shows the half-bridge switch arrangement 100 of FIG. 2a in a perspective view, further comprising a printed circuit board or control board 160. The printed circuit board 160 is arranged above the first semiconductor switching elements 111 and the second semiconductor switching elements 121 at a predetermined distance above the upper surface 186 of the second cuboid section 185. The printed circuit board 160 may be plate-shaped and arranged with its main extension plane (xy-plane in the figure) parallel to the main extension plane of the positive busbar 130, the negative busbar 140 and the output-phase busbar 170 and furthermore to the upper surfaces 182, 186 of the first and second cuboidal sections 181, 185.

As shown in FIGS. 2a and 2b, the individual lengths of the positive busbar 130, the negative busbar 140, the busbar insulating layer 191 and the heat sink insulating layer 192 can each be identical when viewed in the x-direction. Accordingly, the widths of these layers, viewed in the y-direction, can also be identical in each case.

The individual widths in the y-direction of the output-phase busbar 170 and the first and second output-phase insulating layers 195, 196 are each expediently smaller than the width of the positive busbar 130, the negative busbar 140, the busbar insulating layer 191 and the heat sink insulating layer 192.

A part of the arrangement comprising the positive busbar 130, the negative busbar 140, the busbar insulating layer 191 and the heat sink insulating layer 192 is thus not covered by the output-phase busbar 170, the first output-phase insulating layer 195 and the second output-phase insulating layer 196. Further elements can be arranged on this uncovered part and electrically connected to the positive and negative busbars 130, 140.

FIG. 2c shows a perspective view of the half-bridge switch arrangement 100 of FIGS. 2a and 2b. As shown in FIG. 2c, the half-bridge switch arrangement 100 may further comprise one or more capacitor units 150, which may be arranged on this uncovered part of the arrangement comprising the positive busbar 130, the negative busbar 140, the busbar insulating layer 191 and the heat sink insulating layer 192. In the example of FIG. 2c, three such capacitor units 150 are provided. However, it is understood that the half-bridge switch arrangement 100 may also have more or less than three capacitor units 150.

These capacitor units 150 are each of identical construction, for example, and each have at least one discrete capacitor element, for example a plurality of parallel-connected, discrete capacitor elements. Each capacitor unit 150 has a first terminal 151, which is electrically connected in particular directly to the positive busbar 130. Capacitor connection channels 153 are provided in the positive busbar 130, each in the form of a bore or a hole, through which a second terminal 152 of a respective capacitor unit 150 is led, which is electrically connected to the negative busbar 140.

Figure 2D:
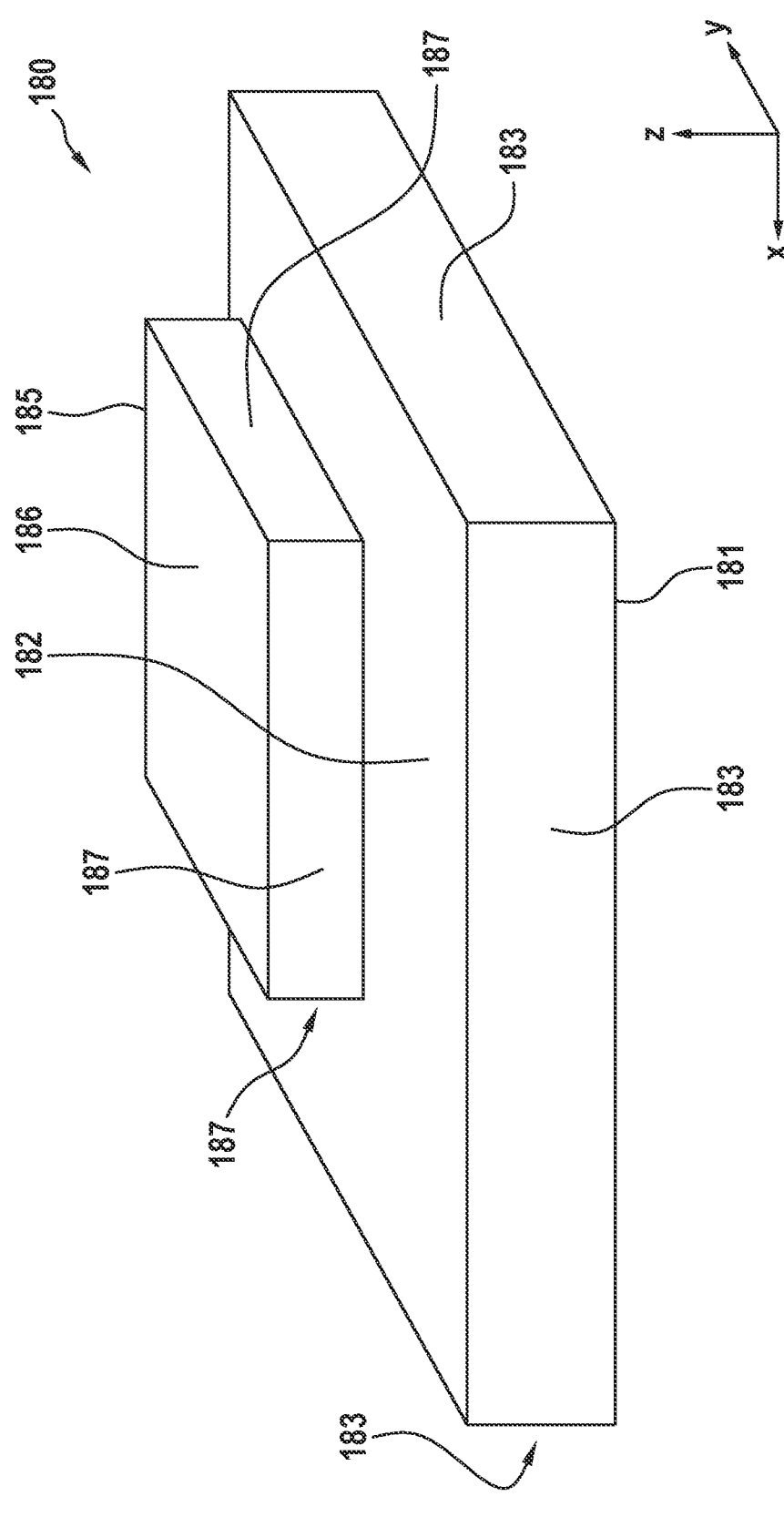

FIG. 2d shows the heat sink 180 of the half-bridge switch arrangement 100 in a perspective view. As shown in FIG. 2d, the top surface 182 of the first cuboid section 181 extends parallel to the xy-plane. Side surfaces 183 of the first cuboid section 181 extend perpendicular to its top surface 182 and parallel to the yz-plane. Correspondingly, the top surface 186 of the second, cuboid section 185 extends parallel to the xy-plane and parallel to the top surface 182 of the first section 181. Side surfaces 187 of the second, cuboid section 182 extend perpendicular to its top surface 186, perpendicular to the top surface 182 of the first section 181 and parallel to the yz-plane.

Figure 3A:
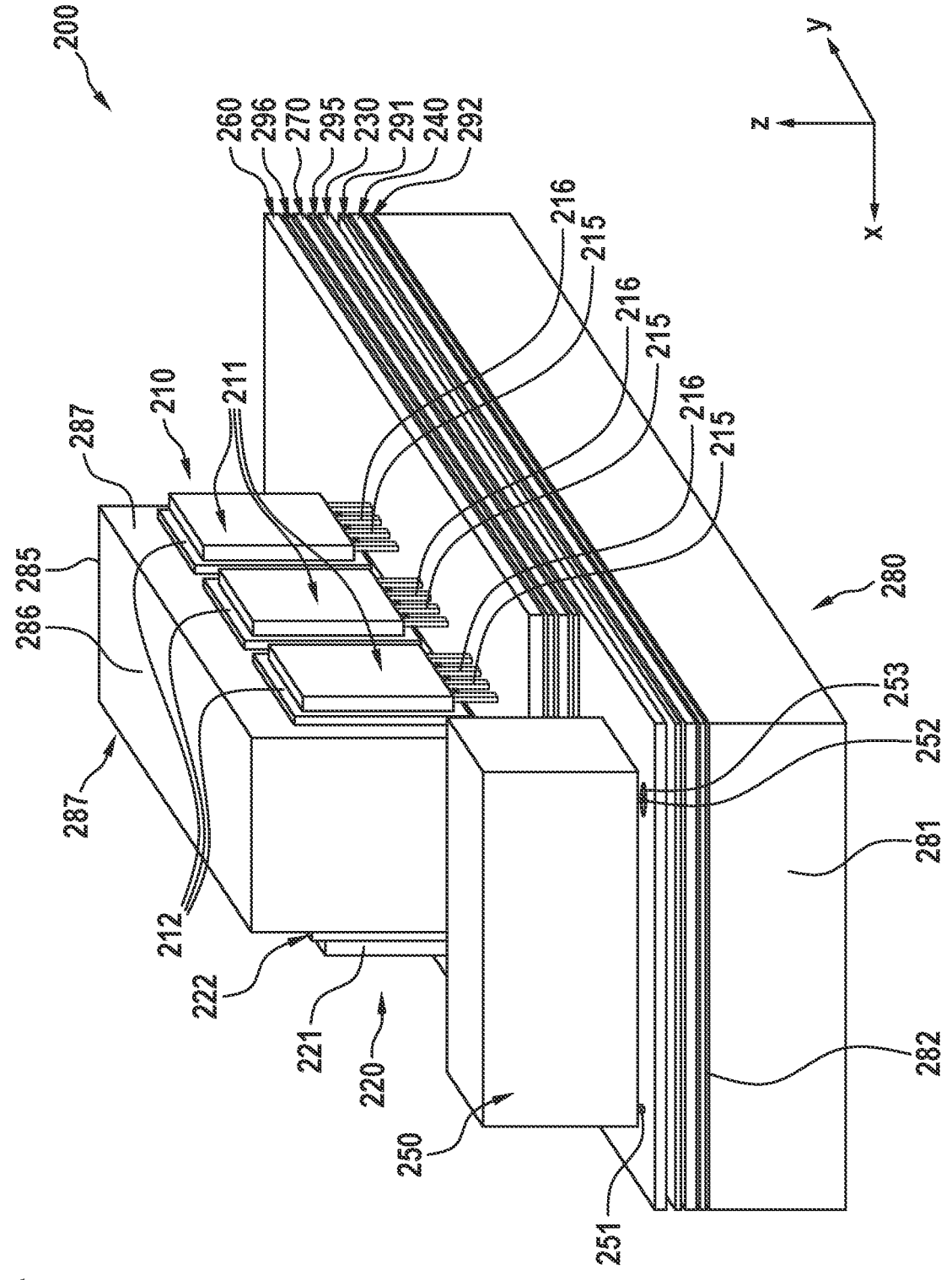
FIGS. 3a-3c schematically show views of a half-bridge switch arrangement, in embodiments.
Figure 3B:
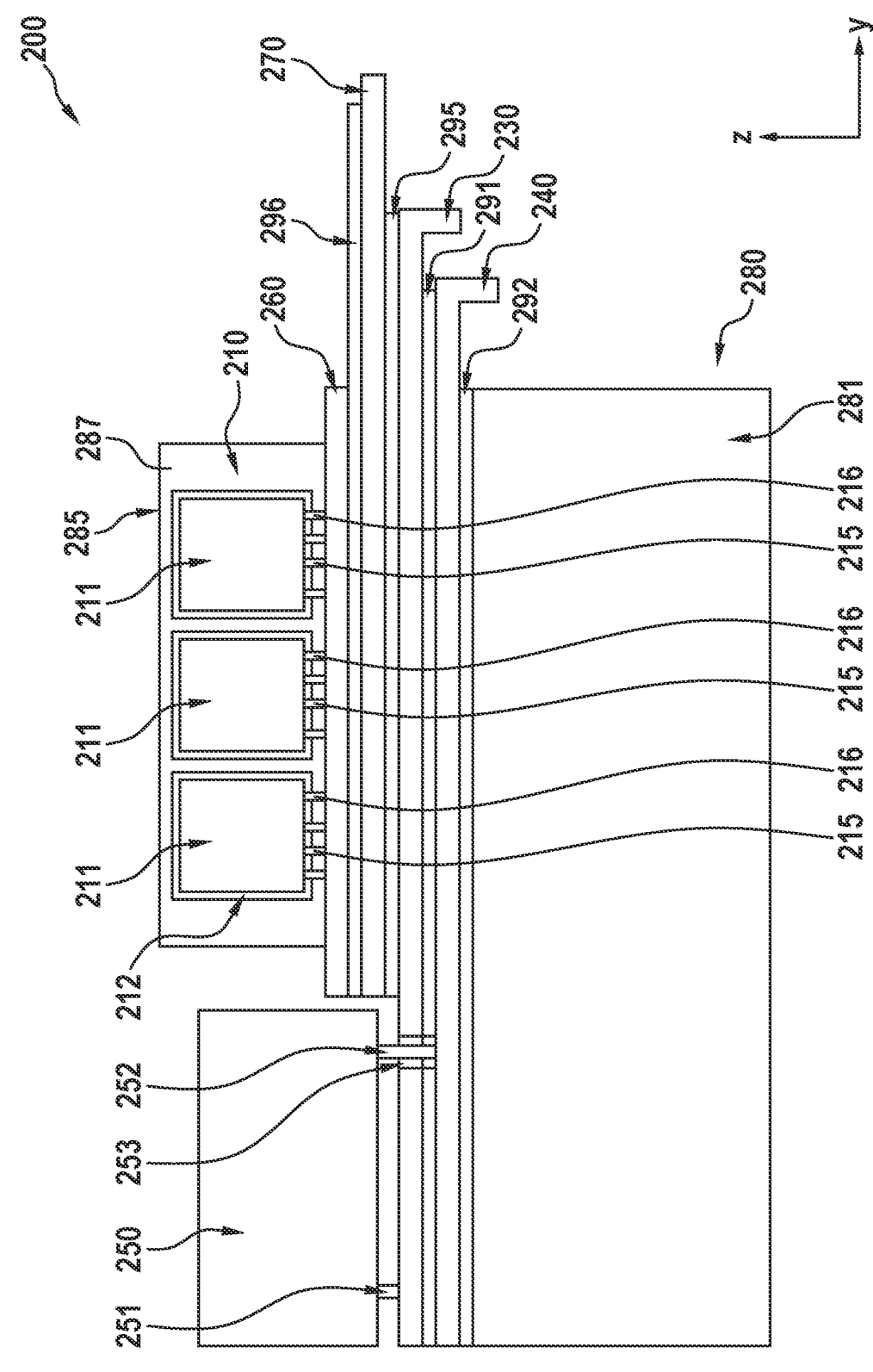

FIGS. 3a and 3b schematically illustrate a further embodiment of the half-bridge switch arrangement according to the disclosure that is labeled 200. FIG. 3a shows the half-bridge switch arrangement 200 in a perspective view and FIG. 3b in a side view.

Figure 3C:
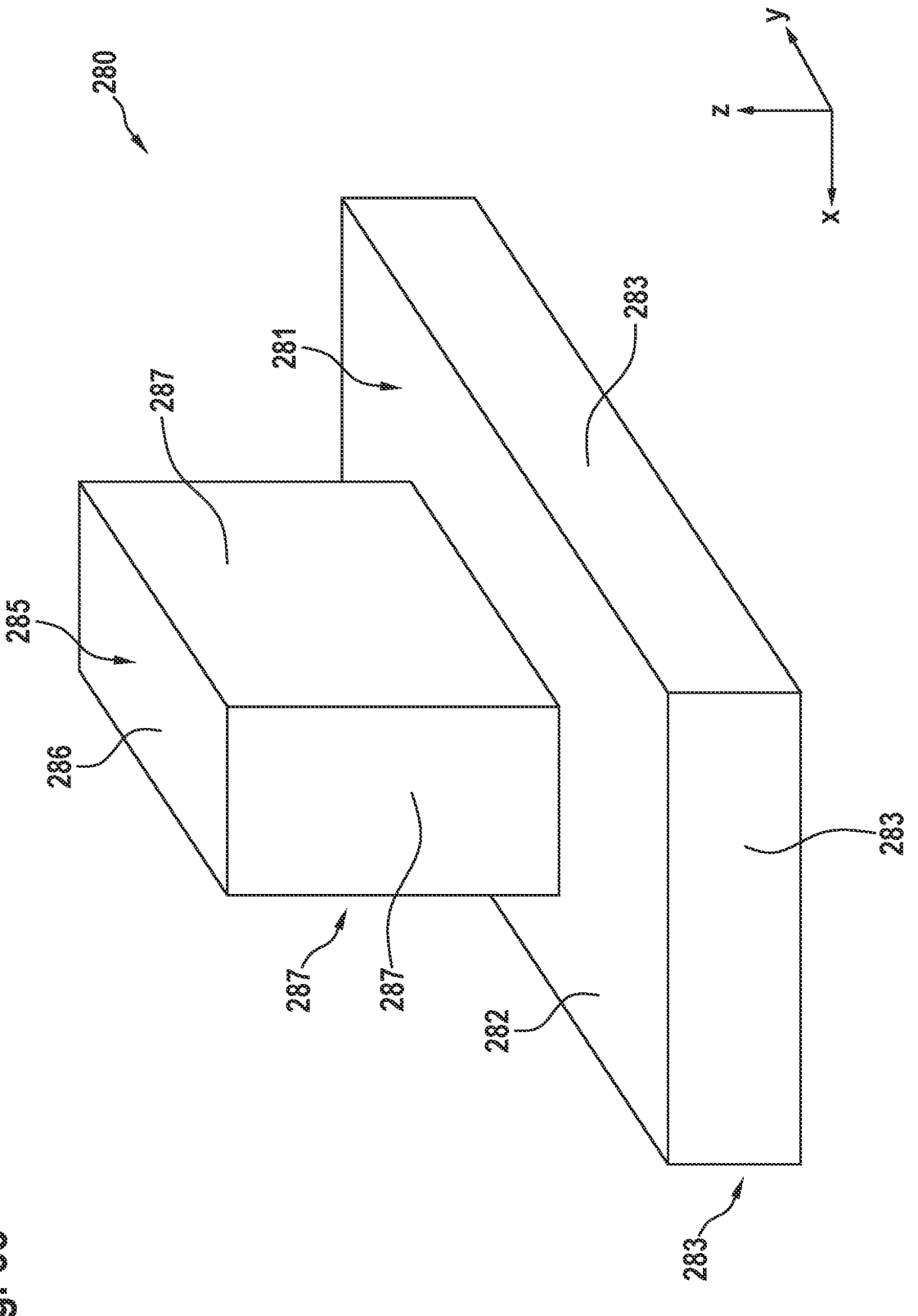

Identical or structurally identical elements of the switch arrangement 200 shown in FIGS. 3a, 3b and 3c are each designated with a reference sign increased by the value "100" in comparison with the switch arrangement 100 shown in FIGS. 2a, 2b, 2c and 2d.

As shown in FIGS. 3a and 3b, according to this embodiment, the first and second semiconductor switching elements 211, 221 are not arranged on the top surface 282, but each on a side surface 287 of the second cuboid section 285 of the heat sink 280.

For example, the first semiconductor switching elements 211 are arranged on a first side surface 287 of the second cuboid section and the second semiconductor switching elements 221 are arranged on a second side surface 287 opposite the first side surface 287. This allows the dimension of the switch arrangement 200 in the x-direction to be reduced compared to the switch arrangement 100, whereas the dimension in the z-direction is increased.

According to this embodiment, the printed circuit board 260 is arranged on the arrangement comprising the positive busbar 230, the negative busbar 240 and the output-phase busbar 270, expediently on the second output-phase insulating layer 296. Accordingly, the printed circuit board 260 also has a recess for the second section 285.

The first, second and third terminals 215, 216 of the first semiconductor switching elements 211 and the first, second and third terminals of the second semiconductor switching elements 221, in particular the drain, source, gate and Kelvin terminals in each case, are not bent according to this embodiment, but run in each case parallel to the main extension plane of the respective semiconductor switching elements 211 or 221 in the z-direction towards the respective busbar or the printed circuit board. The first, second and third terminals of the second semiconductor switching elements 221 are concealed and not explicitly shown in the perspective view of FIG. 3a and the side view of FIG. 3b.

FIG. 3c shows the heat sink 280 of the arrangement 200 in a perspective view. As shown in FIG. 3c, the length in the x-direction and the width in the y-direction of the first cuboid section 281 can each be greater than the length and width, respectively, of the second cuboid section 285. The height in the z-direction of the second cuboid section 285 can be greater than the height of the first cuboid section 281 according to this embodiment.

We claim:

1. A half-bridge switch arrangement (1, 100, 200), comprising:
   a high-side switch (10, 110, 210) comprising a plurality of parallel-connected first semiconductor switching elements (11, 111, 211),
   a low-side switch (20, 120, 220) comprising a plurality of parallel-connected second semiconductor switching elements (21, 121, 221),
   a positive busbar (130, 230), to which a first terminal of each of the first semiconductor switching elements (11, 111, 211) of the high-side switch (10, 110, 210) is electrically connected,
   a negative busbar (140, 240), to which a second terminal of each of the second semiconductor switching elements (21, 121, 221) of the low-side switch (20, 120, 220) is electrically connected, and
   a heat sink (180, 280),
   wherein the heat sink (180, 280) has a first section (181, 281) and a second section (185, 285) arranged on the first section (181, 281),
   wherein the first semiconductor switching elements (11, 111, 211) and the second semiconductor switching elements (21, 121, 221) are arranged at the second section (185, 285),
   wherein the positive busbar (130, 230) and the negative busbar (140, 240) are arranged one above the other on an upper side (182, 282) of the first section (181, 281).

2. The half-bridge switch arrangement according to claim 1, wherein the positive busbar (130, 230) and the negative busbar (140, 240) are each formed in the shape of a plate and each have a recess through which the second section (185, 285) projects, or wherein the positive busbar and the negative busbar are formed as components of a common printed circuit board which has a recess through which the second section projects.

3. The half-bridge switch arrangement according to claim 1, further comprising an output-phase busbar (170, 270) to which a second terminal of each of the first semiconductor switching elements (11, 111, 211) and a first terminal of each of the second semiconductor switching elements (21, 121, 221) is electrically connected, wherein the positive busbar (130, 230), the negative busbar (140, 240) and the output-phase busbar (170, 270) are arranged one above the other on the upper side (182, 282) of the first section (181, 281) or wherein the positive busbar, the negative busbar and the output-phase busbar are formed as components of a common printed circuit board which is arranged on the upper side of the first section.

4. The half-bridge switch arrangement according to claim 3, wherein the output-phase busbar (170, 270) is plate-shaped and has a recess through which the second section (185, 285) projects.

5. The half-bridge switch arrangement according to claim 3, further comprising at least one electrical output-phase insulating layer (195, 196), wherein the output-phase busbar (170, 270) is electrically insulated from the positive busbar (130, 230) and/or from the negative busbar (140, 240) and/or from the heat sink (180, 280) by the at least one electrical output-phase insulating layer (195, 196).

6. The half-bridge switch arrangement according to claim 1, wherein the first semiconductor switching elements (111) and the second semiconductor switching elements (121) are each arranged on an upper side (186) of the second section (185).

7. The half-bridge switch arrangement according to claim 6, wherein the respective terminals of the first semiconductor switching elements (111) and the second semiconductor switching elements (121) for connection to the positive busbar (130) and the negative busbar (140) are respectively bent or kinked in the direction of the first section (181).

8. The half-bridge switch arrangement according to claim 6, further comprising a printed circuit board (160), wherein the printed circuit board (160) is arranged above the first semiconductor switching elements (111) and second semiconductor switching elements (121) arranged on the upper side (186) of the second section (185), wherein in each case at least one third terminal (116) of the first semiconductor switching elements (111) and in each case at least one third terminal (126) of the second semiconductor switching elements (121) is bent or kinked in the direction of the printed circuit board (160) for connection to the printed circuit board (160).

9. The half-bridge switch arrangement according to claim 1, wherein the first semiconductor switching elements (211) and the second semiconductor switching elements (221) are each arranged on a side surface (287) of the second section (285).

10. The half-bridge switch arrangement according to claim 9, further comprising a printed circuit board (260), wherein the printed circuit board (260) is arranged on the arrangement of the positive busbar (230), the negative busbar (240) and the output-phase busbar (270), at least one third terminal (216, 226) of each of the first semiconductor switching elements (211) and second semiconductor switching elements (221) arranged on the side surfaces (287) of the second section (285) being connected to the printed circuit board (260).

11. The half-bridge switch arrangement according to claim 10, wherein the printed circuit board (260) is plate-shaped and has a recess (261) through which the second section (285) protrudes.

12. The half-bridge switch arrangement according to claim 1, further comprising a capacitor unit (50, 150, 250) comprising at least one capacitor element, wherein the capacitor unit (50, 150, 250) is arranged on the arrangement of the positive busbar (130, 230) and negative busbar (140, 240).

13. The half-bridge switch arrangement according to claim 12, wherein a first terminal (151, 251) of the capacitor unit (50, 150, 250) is electrically connected to the positive busbar (130, 230) and wherein a second terminal (151, 251) of the capacitor unit (50, 150, 250) is electrically connected to the negative busbar (140, 240), wherein in a first busbar (130, 230) selected from the positive busbar (130, 230) and negative busbar (140, 240), which is arranged further upwards as viewed from the first section (181, 281), a capacitor connection channel (153, 253) is provided, through which the terminal (152, 252) of the capacitor unit (50, 150, 250) is passed, which is electrically connected to a second busbar (140, 240) selected from the positive busbar (130, 230) and negative busbar (140, 240).

14. The half-bridge switch arrangement according to claim 1, further comprising an electrical busbar insulating layer (191, 291), wherein the positive busbar (130, 230) and the negative busbar (140, 240) are electrically insulated from each other by the electrical busbar insulating layer (191, 291).

15. The half-bridge switch arrangement according to claim 1, further comprising an electrical heat sink insulating layer (192, 292), wherein the arrangement of the positive busbar (130, 230) and the negative busbar (140, 240) is electrically insulated from the heat sink (180, 280) by the electrical heat sink insulating layer (192, 292).

16. The half-bridge switch arrangement according to claim 1, further comprising at least one first electrical switching element insulating layer (112, 212) and at least one second electrical switching element insulating layer (122, 222), wherein the first semiconductor switching elements (111, 121) are electrically insulated from the heat sink (180, 280) by the at least one first electrical switching element insulating layer (112, 212), and wherein the second semiconductor switching elements (121, 221) are electrically insulated from the heat sink (180, 280) by the at least one second electrical switching element insulating layer (122, 222).

* * * * *